(12) United States Patent
Liu et al.

(10) Patent No.: US 7,199,762 B2
(45) Date of Patent: Apr. 3, 2007

(54) WIRELESS DEVICE WITH DISTRIBUTED LOAD

(75) Inventors: Hongwei Liu, South Elgin, IL (US); Adrian Napoles, Lake Villa, IL (US); Benjamin O. White, Crystal lake, IL (US)

(73) Assignee: Motorola Inc., Schaumburg, IL (US)

( * ) Notice: Subject to any disclaimer, the term of this patent is extended or adjusted under 35 U.S.C. 154(b) by 38 days.

(21) Appl. No.: 11/210,324

(22) Filed: Aug. 24, 2005

(65) Prior Publication Data

US 2007/0052596 A1  Mar. 8, 2007

(51) Int. Cl.
*H01Q 1/24* (2006.01)

(52) U.S. Cl. .............................. 343/702; 343/700 MS; 343/846

(58) Field of Classification Search ............... 343/702, 343/700 MS, 846, 848; 455/575.1, 575.3
See application file for complete search history.

(56) References Cited

U.S. PATENT DOCUMENTS

| | | | | |
|---|---|---|---|---|
| 5,170,173 A | * | 12/1992 | Krenz et al. ................. | 343/702 |
| 5,367,311 A | | 11/1994 | Egashira et al. | |
| 5,828,341 A | * | 10/1998 | Delamater ................... | 343/702 |
| 6,762,723 B2 | * | 7/2004 | Nallo et al. .......... | 343/700 MS |
| 6,888,504 B2 | * | 5/2005 | Chiang et al. ............... | 343/702 |
| 2004/0090372 A1 | * | 5/2004 | Nallo et al. .......... | 343/700 MS |
| 2004/0125039 A1 | | 7/2004 | Sasaki et al. | |
| 2005/0088346 A1 | | 4/2005 | Hwang et al. | |

OTHER PUBLICATIONS

U.S. Appl. No. 10/698,249, filed Oct. 31, 2003, Black et al.
U.S. Appl. No. 11/024,063, filed Dec. 28, 2004, Krenz et al.

* cited by examiner

*Primary Examiner*—Hoanganh Le
(74) *Attorney, Agent, or Firm*—Sylvia Chen

(57) ABSTRACT

A wireless device (100) includes a first circuit board (102), a second circuit board (104), and a distributed load (106) having an inductive coupling (112) and a capacitive coupling (114). The inductive coupling (112) and the capacitive coupling (114) form a parallel resonance at predefined frequencies of interest. The second circuit board (104) includes an antenna (116) for receiving and transmitting radio waves.

20 Claims, 9 Drawing Sheets

WIRELESS DEVICE WITH DISTRIBUTED LOAD

FIELD OF THE INVENTION

The present invention generally relates to wireless devices and more specifically, to an apparatus for tuning impedance in wireless devices.

BACKGROUND OF THE INVENTION

An antenna plays an important role in providing reliable communication in a wireless device. The growing trend of incorporating antennae in the bodies of wireless devices has increased the size of the wireless devices. This trend goes against the modern norms of having smaller-sized wireless devices with increased aesthetic value. One way to increase the aesthetic value of the wireless device is to shorten the mechanical length of the wireless device. However, shortening the mechanical length of the wireless device results in shortened electrical lengths of circuit boards in the wireless devices. The shortened electrical length reduces the efficiency of the wireless device at low frequency ranges. The reduced efficiency results from the lower impedance value of the shortened electrical length, thereby leading to an ineffective resonance setting at lower frequencies.

The problem of reduced efficiency is prevalent in wireless devices having multiple circuit boards, such as "clamshell" devices. This is due to the requirement for tuning the impedance of the circuit boards, and also the antenna. Additionally, one of the circuit boards incorporates the antenna, thus increasing the mechanical length of that circuit board.

BRIEF DESCRIPTION OF THE DRAWINGS

The present invention is illustrated by way of example and not limitation in the accompanying figures, in which like references indicate similar elements, and in which.

Figure 1:
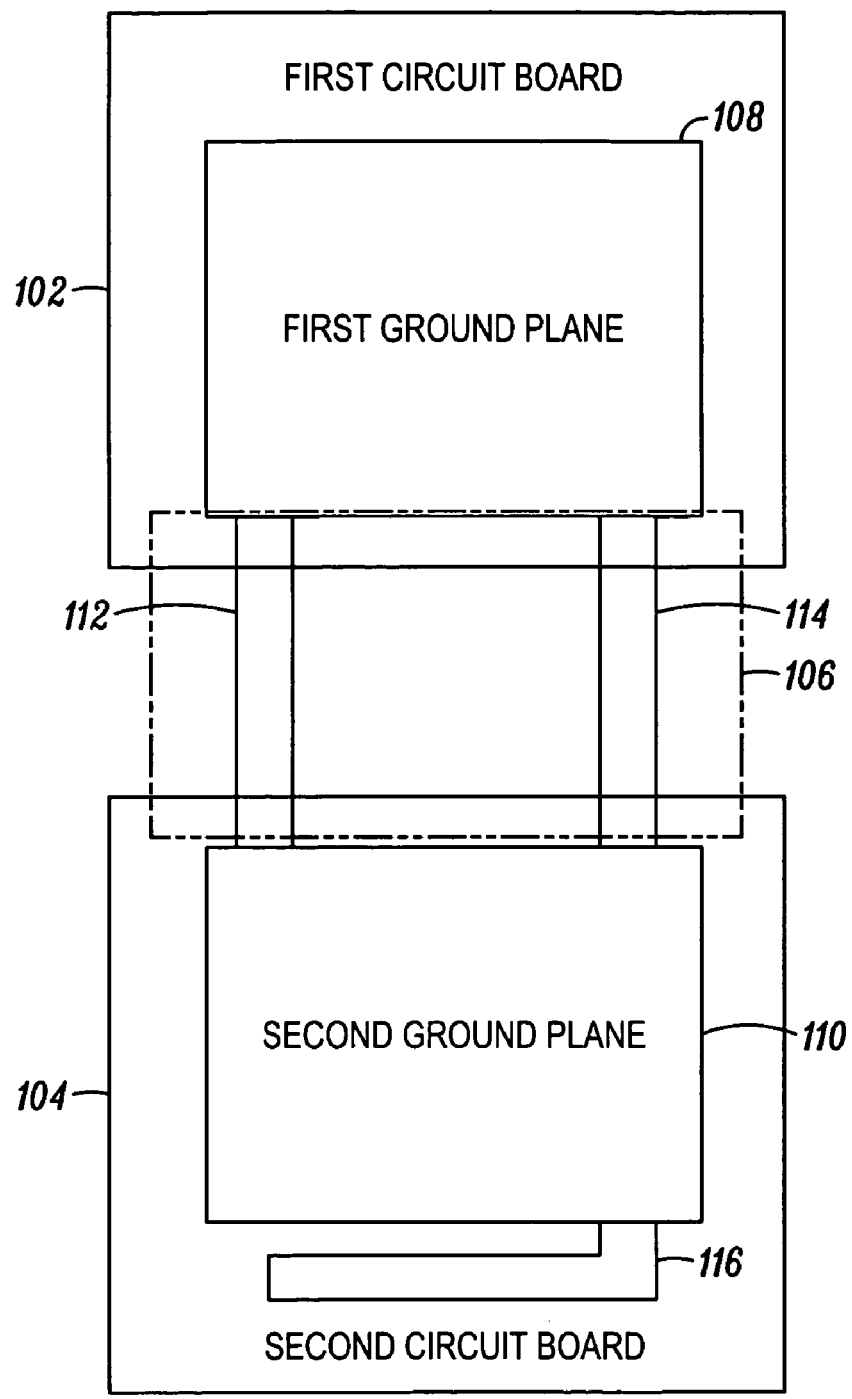
FIG. 1 shows an exemplary block diagram of a wireless device in accordance with an embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE EMBODIMENTS

Before describing in detail the particular wireless device in accordance with the present invention, it should be observed that the present invention resides primarily in the components of the wireless device apparatus. Accordingly, the apparatus components have been represented where appropriate by conventional symbols in the drawings, showing only those specific details that are pertinent for an understanding the present invention so as not to obscure the disclosure with details that will be readily apparent to those of ordinary skill in the art having the benefit of the description herein.

A wireless device with a distributed load reduces mechanical length and improves performance at low frequency bands. Exemplary wireless devices that can benefit from distributed loads include devices with multiple circuit boards such as "clamshell" phones and other foldable, slider-type, or rotatable mobile communication devices. Further, multi-band wireless devices that operate at more than one frequency band can benefit from distributed loads. The introduction of a distributed load between two circuit boards of the wireless device reduces the effective electrical length needed for improved performance of the wireless device. The distributed load has an inductive coupling and a capacitive coupling. The distributed load produces adequate impedance to create parallel resonances at predetermined frequencies of interest.

FIG. 1 shows an exemplary block diagram of a wireless device 100 in accordance with an embodiment. In this embodiment the wireless device is foldable, but foldability is not required. The wireless device 100 has a first circuit board 102, a second circuit board 104, and a distributed load 106. The first circuit board 102 on a first ground plane 108 inside a first printed circuit board (PCB) is placed on a cover side of the foldable wireless device 100. The second circuit board 104 on a second ground plane 110 inside a second PCB is placed on a base side of the foldable wireless device 100. In this embodiment, the cover side of the wireless device additionally includes a display module for displaying information on the wireless communications device's screen. The base side of the wireless device additionally includes a keypad module for receiving user input through a keypad of the wireless device.

The distributed load 106 includes an inductive coupling 112 and a capacitive coupling 114. The inductive coupling 112 is located between the first ground plane 108 and the second ground plane 110, and is grounded on both the ground planes. The inductive coupling 112 and the capacitive coupling 114 produce a parallel resonance at a frequency of interest. The frequency of interest can be varied by adjusting the characteristics of the inductive coupling 112 and the capacitive coupling 114. The frequency of interest depends on the norms of the regions where the wireless device 100 is being used. For multi-band wireless devices there are multiple frequencies of interest at which the resonance is established between the parallel inductive and capacitive couplings.

The second circuit board 104 has an antenna 116 for receiving and transmitting radio signals. The antenna 116 can be of any shape, form and size without limiting the scope of the invention. For example, the antenna 116 is a folded J antenna. The impedance of the antenna 116 is tuned with the impedances of the first circuit board 102 and the second circuit board 104.

Figure 2:
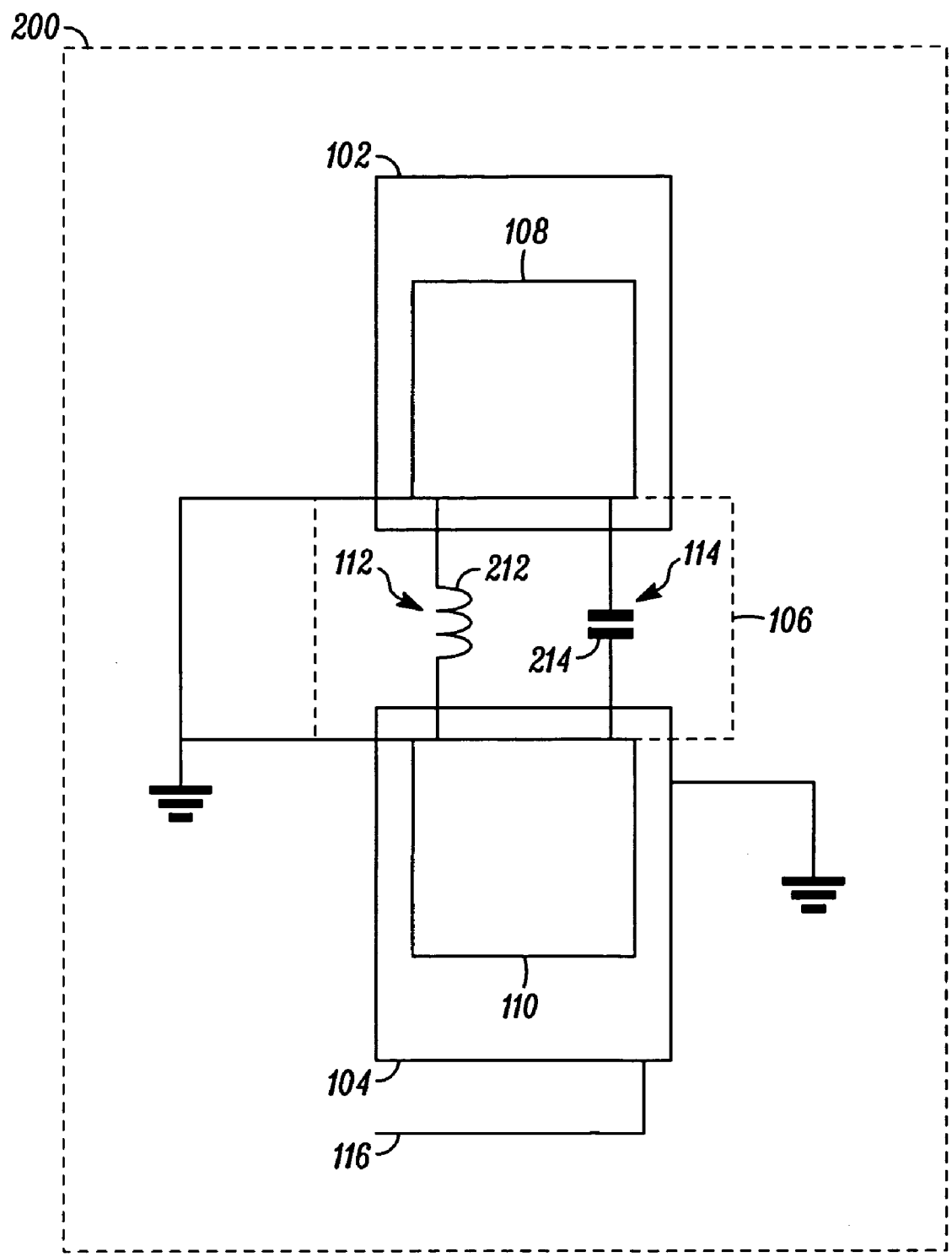
FIG. 2 shows an exemplary circuit diagram of the wireless device of FIG. 1

FIG. 2 shows an electrical representation 200 of the wireless device 100 shown in FIG. 1. The distributed load 106 between the first ground plane 108 and the second ground plane 110 is provided using the inductive coupling 112, and the capacitive coupling 114. The inductive coupling 112 introduces an inductive load, and the capacitive coupling 114 introduces a capacitive load. The values of the inductive load and the capacitive load can be varied to produce resonance at frequencies of interest. In the electrical representation 200, element 212 represents the inductive coupling 112 and element 214 represents the capacitive coupling 114. The total impedance generated by the distributed load 106 sums to the impedance between the first circuit board 102 and the second circuit board 104, hence reducing the electrical length.

Figure 3:
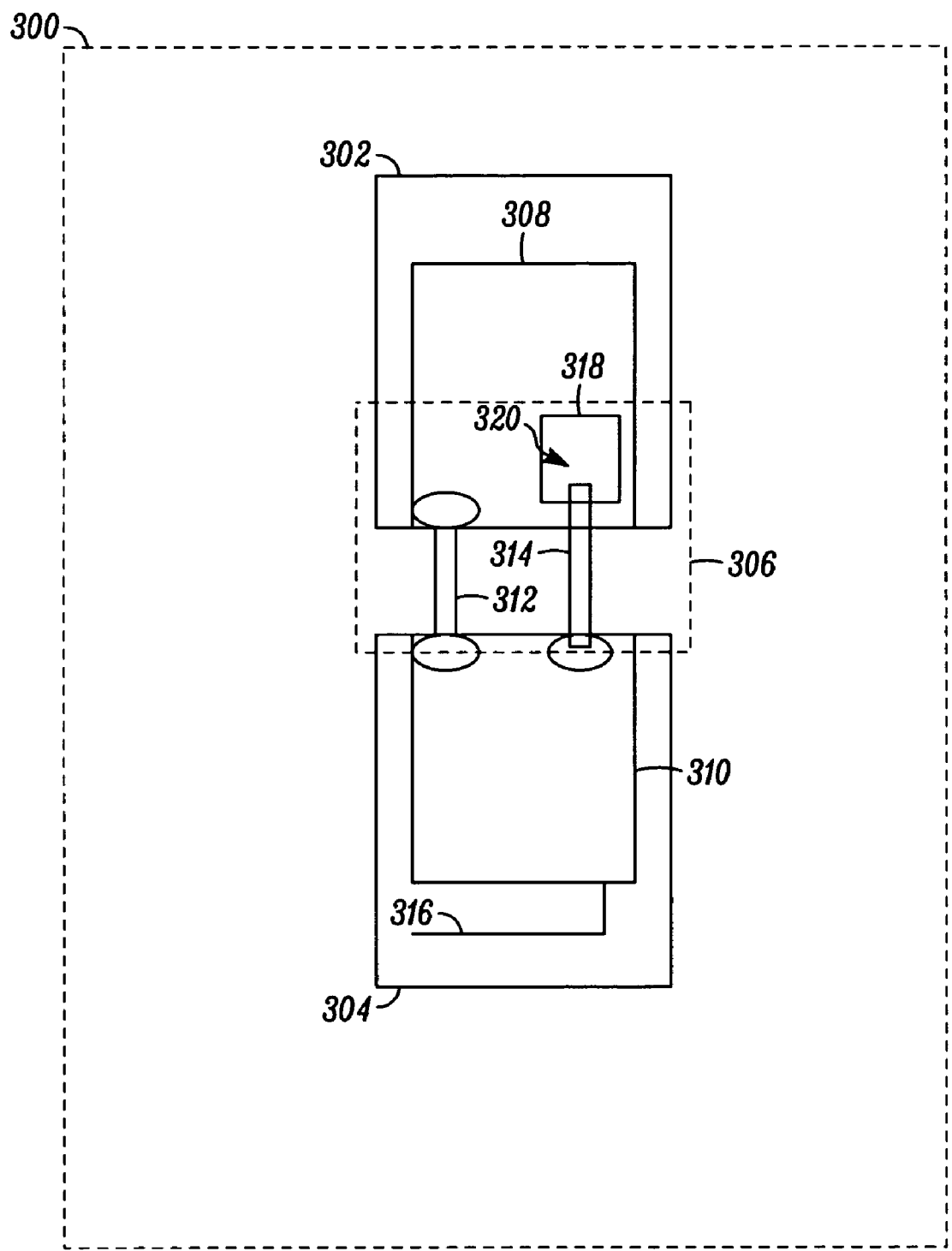
FIG. 3 shows an exemplary wireless device with a distributed load in accordance with a first detailed embodiment.

FIG. 3 shows a block diagram illustrating an exemplary wireless device 300 with a distributed load in accordance with a first embodiment. The wireless device 300 includes a first circuit board 302, a second circuit board 304, and a distributed load 306. The first circuit board 302 includes a first ground plane 308, and the second circuit board 304 includes a second ground plane 310 and an antenna 316. The distributed load 306 has an inductive coupling 312 and a capacitive coupling 314. The capacitive coupling 314 is placed between the first ground plane 308 and the second ground plane 310. The capacitive coupling 314 is physically grounded on the second ground plane 310 but is floating over the first ground plane 308. In this embodiment, a flat patch 318 is used to create a floating connection 320 to form the capacitive coupling 314. In accordance with an embodiment, the flat patch 318 is physically and electrically coupled to the second ground plane 310 and capacitively coupled to the first ground plane 308. The flat patch 318 can be made of any material having a high coefficient of electric conductivity. Examples of materials used for making the flat patch 318 include metals such as copper and aluminum. The flat patch 318 is further described in conjunction with FIG. 4.

Figure 4:
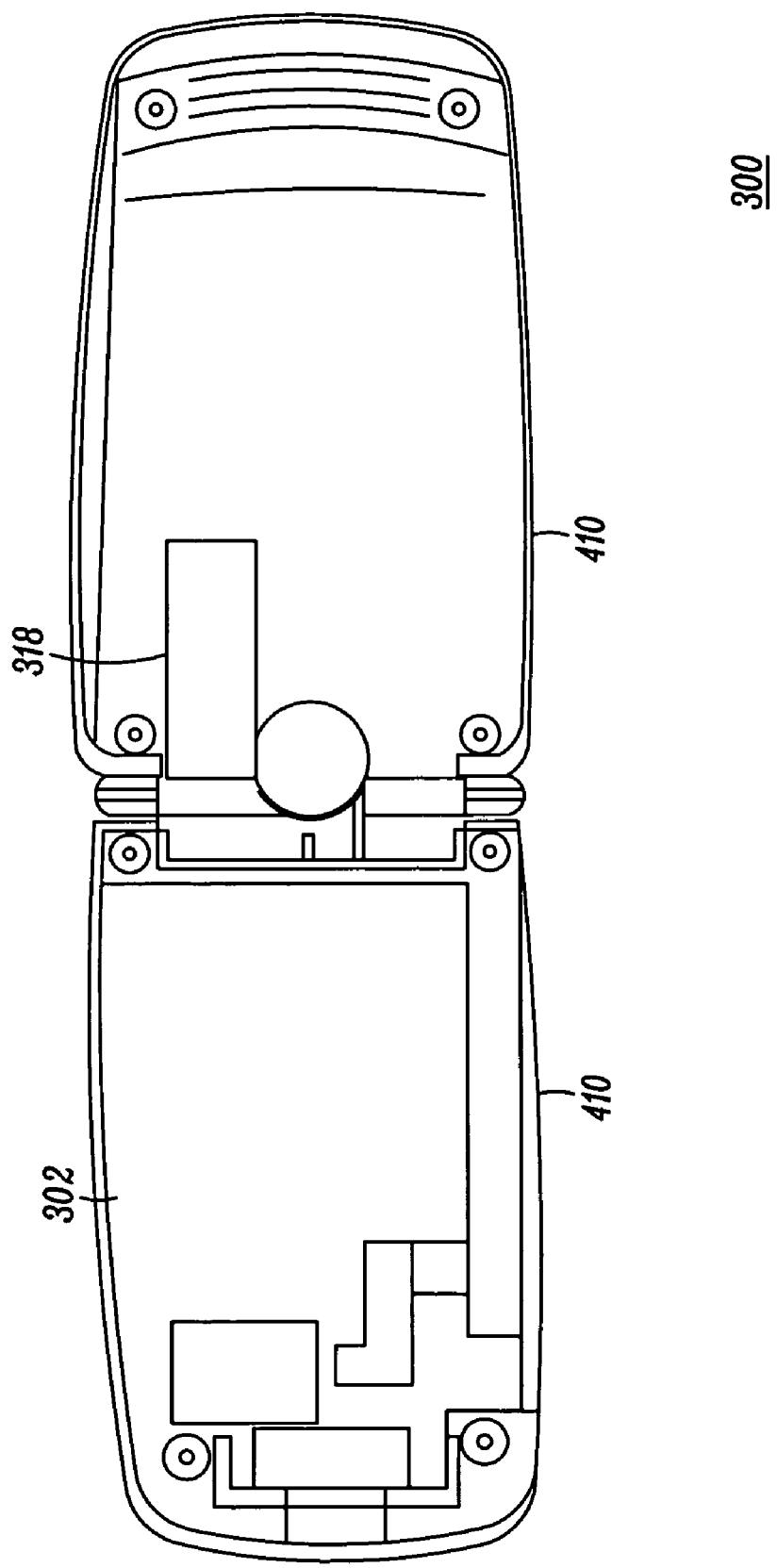
FIG. 4 shows a diagram illustrating a patch in accordance with the first detailed embodiment as shown in FIG. 3.

FIG. 4 shows a diagram illustrating the flat patch 318 in accordance with the first detailed embodiment as shown in FIG. 3. The flat patch 318 has been introduced beside the first circuit board 302 in a cover housing 410 of a wireless device. When the cover housing 410 is assembled, the flat patch 318 is separated from a display module at the first circuit board 302 by an air gap. The flat patch 318 has a connection to the second circuit board 304 (not shown) placed at the base side of the wireless device 300. The placement of the flat patch 318 at the cover side of the wireless device reduces the electrical length of the second circuit board 304 at the base side of the wireless device 300.

Figure 5:
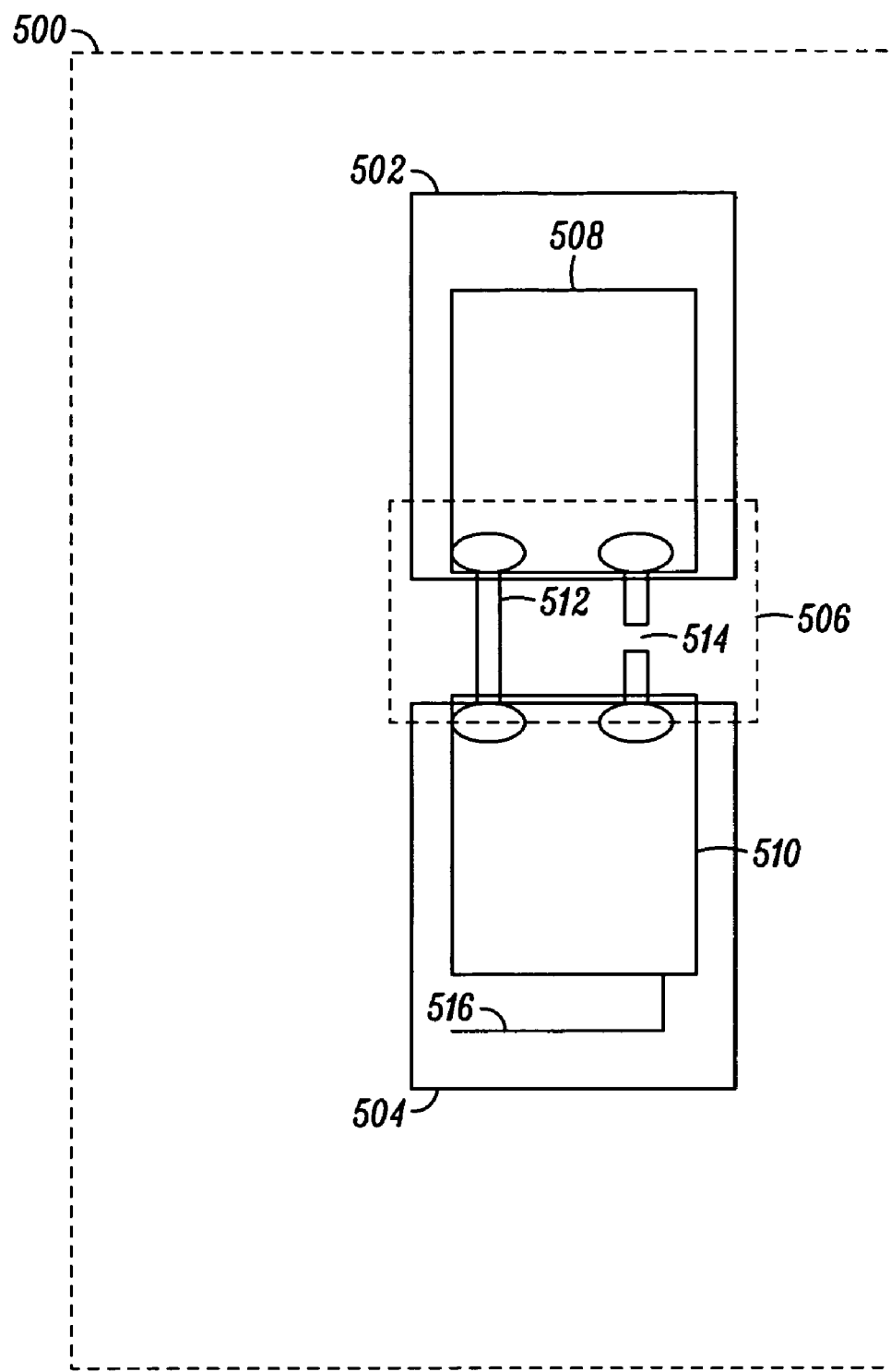
FIG. 5 shows an exemplary wireless device with a distributed load in accordance with a second detailed embodiment.

FIG. 5 shows a block diagram illustrating an exemplary wireless device 500 with a distributed load in accordance with a second detailed embodiment. In this embodiment, the wireless device has hinges for foldability. In the second detailed embodiment, the wireless device 500 includes a first circuit board 502 and a second circuit board 504. The first circuit board 502 includes a first ground plane 508, and the second circuit board 504 includes a second ground plane 510 and an antenna 516. A distributed load 506 includes an inductive load 512 and a capacitive load 514. The inductive load 512 directly connects to the first ground plane 508 and the second ground plane 510. The capacitive load is introduced by an air gap between a conductive protrusion of the first circuit board 502 and a conductive cylinder of the second circuit board 504. Examples of the materials used for making the conductive cylindrical coupler include metals such as copper and aluminum. In accordance with an embodiment, the inductive load 512 and the capacitive load 514 are supported using a pair of hinges of the foldable wireless device 500.

Figure 6:
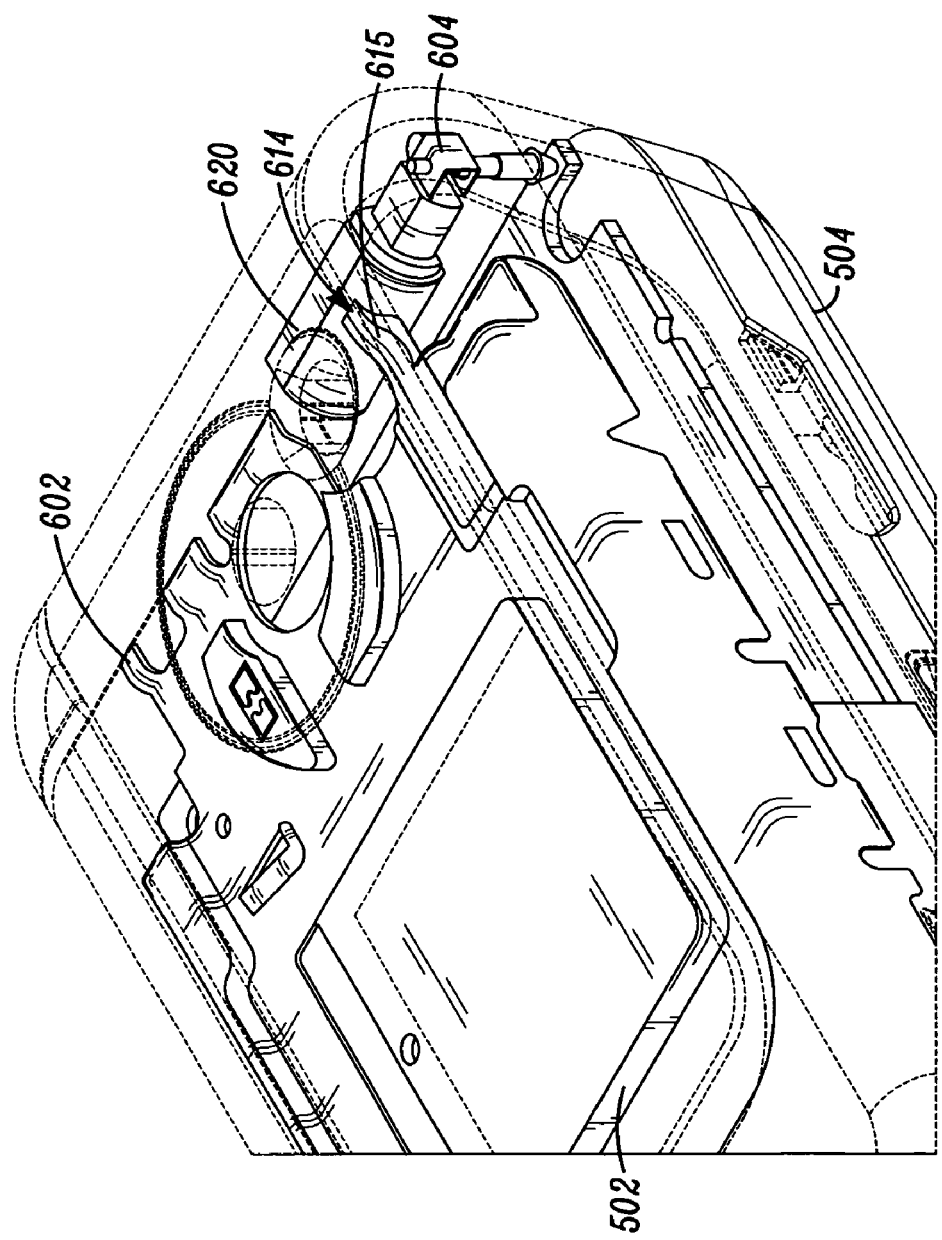
FIG. 6 shows a diagram illustrating a capacitive coupling in accordance with the second detailed embodiment as shown in FIG. 5.

FIG. 6 shows a diagram illustrating a capacitive coupling through a cylindrical capacitive coupler in accordance with the second detailed embodiment as shown in FIG. 5. In this second embodiment, the capacitive coupling 514 shown in FIG. 5 is implemented as an air gap 614 between a metal finger 615 physically and electrically coupled to the first circuit board 502 and a conductive barrel 620 physically and electrically coupled to the second circuit board 504. The first circuit board 502 and the second circuit board 504 are connected using a pair of hinges: a first hinge 602 and a second hinge 604. In this embodiment, the pair of hinges is placed opposite to where the antenna 516 (not shown in FIG. 6) is placed in the second circuit board 504. The first hinge 602 supports the inductive coupling 512 (not shown in FIG. 6), and the second hinge 604 supports the capacitive coupling 514. The distributed load 506, as supported by the pair of hinges, 602, 604 produces sufficient impedance required by the antenna 516 for efficiently receiving/transmitting radio waves.

The capacitive coupling 514 is introduced across the first circuit board 502 and the second circuit board 504, using a cylindrical barrel 620 placed perpendicular to, and along, the second hinge 604. The metal finger 615 does not directly contact the conductive barrel 620, and the air gap 614 between the metal finger and the conductive barrel provides the capacitive coupling 514 (shown in FIG. 5). The distributed load 506 as introduced, reduces the electrical length of the second circuit board 504, and hence reduces the overall mechanical length of the base side of the wireless device 500. Additionally, the introduction of the distributed load 506 improves the efficiency of the antenna at lower frequencies.

Figure 7:
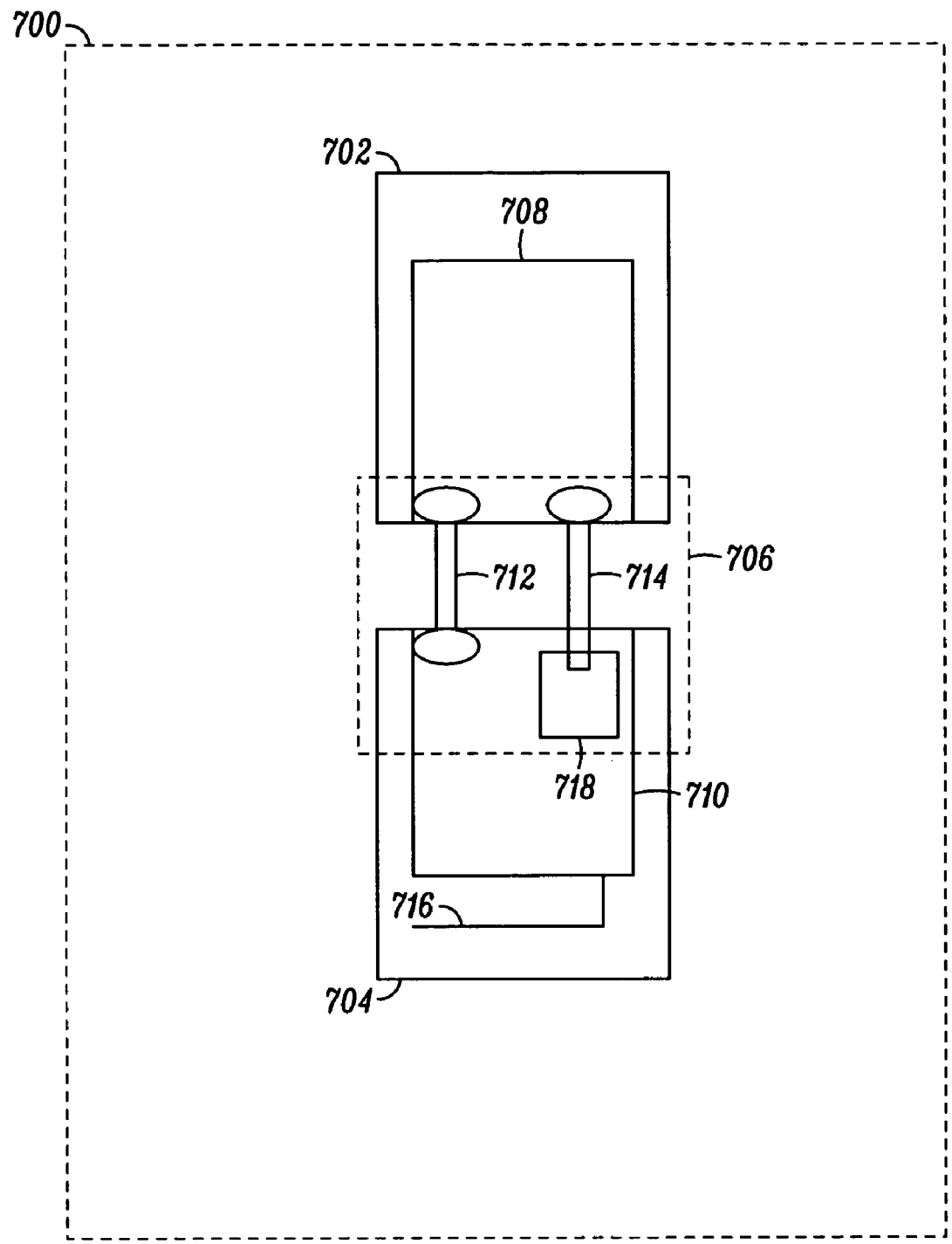
FIG. 7 shows a block diagram illustrating an exemplary wireless device with a distributed load in accordance with a third detailed embodiment.

FIG. 7 shows a block diagram illustrating an exemplary wireless device 700 with a distributed load in accordance with a third detailed embodiment. This third embodiment is similar to the first embodiment and demonstrates that the capacitive coupling 114 shown in FIG. 1 can be implemented in a variety of ways. The wireless device 700 includes a first circuit board 702, a second circuit board 704, and a distributed load 706. The first circuit board 702 includes a first ground plane 708, and the second circuit board 704 includes a second ground plane 710 and an antenna 716. The distributed load 706 includes an inductive coupling 712 and a capacitive coupling 714. The capacitive coupling 714 is placed between the first ground plane 708 and the second ground plane 710. The capacitive coupling 714 is grounded on the second ground plane 710 but is floating over the first ground plane 708. In this embodiment, a flat patch 718 creates the floating connection. The flat patch 718 can be made of any material having high coefficient of electric conductivity. Examples of materials used for making the flat patch 718 include metals such as copper and aluminum.

Figure 8:
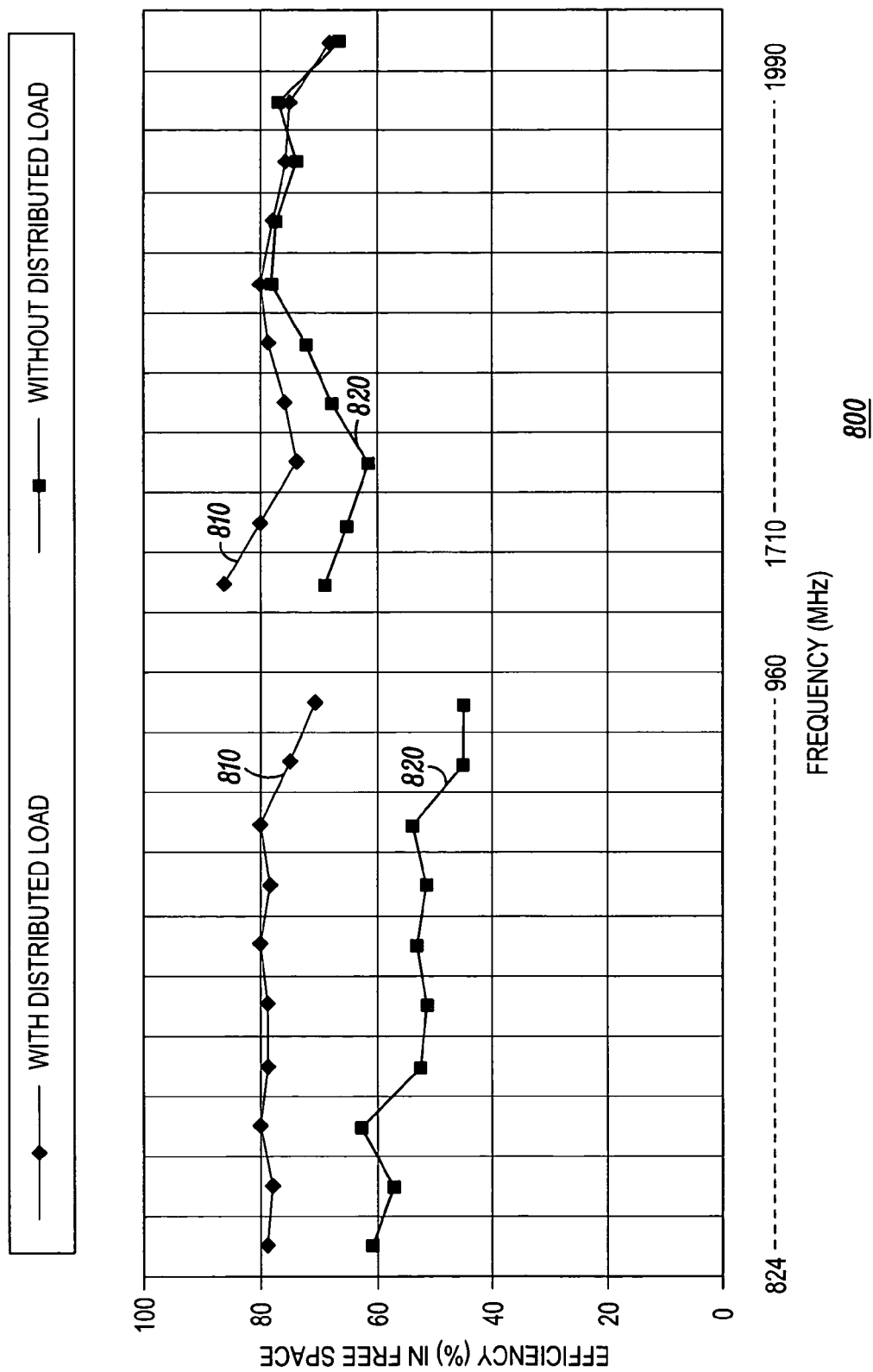
FIG. 8 shows an efficiency versus frequency chart illustrating the efficiency of a wireless device at various frequencies, in accordance with the first embodiment as shown in FIG. 3 and FIG. 4.

FIG. 8 shows an efficiency versus frequency chart 800 illustrating the efficiency of the wireless device 100 at various frequencies as compared to a wireless device without a distributed load. The tested wireless device with distributed load was implemented in accordance with the first detailed embodiment (shown in FIG. 3 and FIG. 4). The efficiency of the wireless device 100 is defined as the percentage of the input power provided to the antenna 116 that is radiated by the antenna 116. As shown in FIG. 8, efficiency (%) of the wireless device in free space (shown with a gray line 810) increases at lower frequency range (824–960 MHz), with the introduction of the distributed load 106. Additionally, there is a slight increase at the higher frequency range (1710–1990 MHz). This is an additional advantage to the fact that the mechanical length of the wireless device 100 is reduced. The efficiency improves at lower frequencies because the impedance required by the antenna 116 at lower frequencies for producing resonance is provided by the second circuit board 104 with the distributed load 106. In the absence of the distributed load 106, the required impedance is not provided and hence the efficiency (shown with a black line 820) suffers at lower frequencies.

Figure 9:
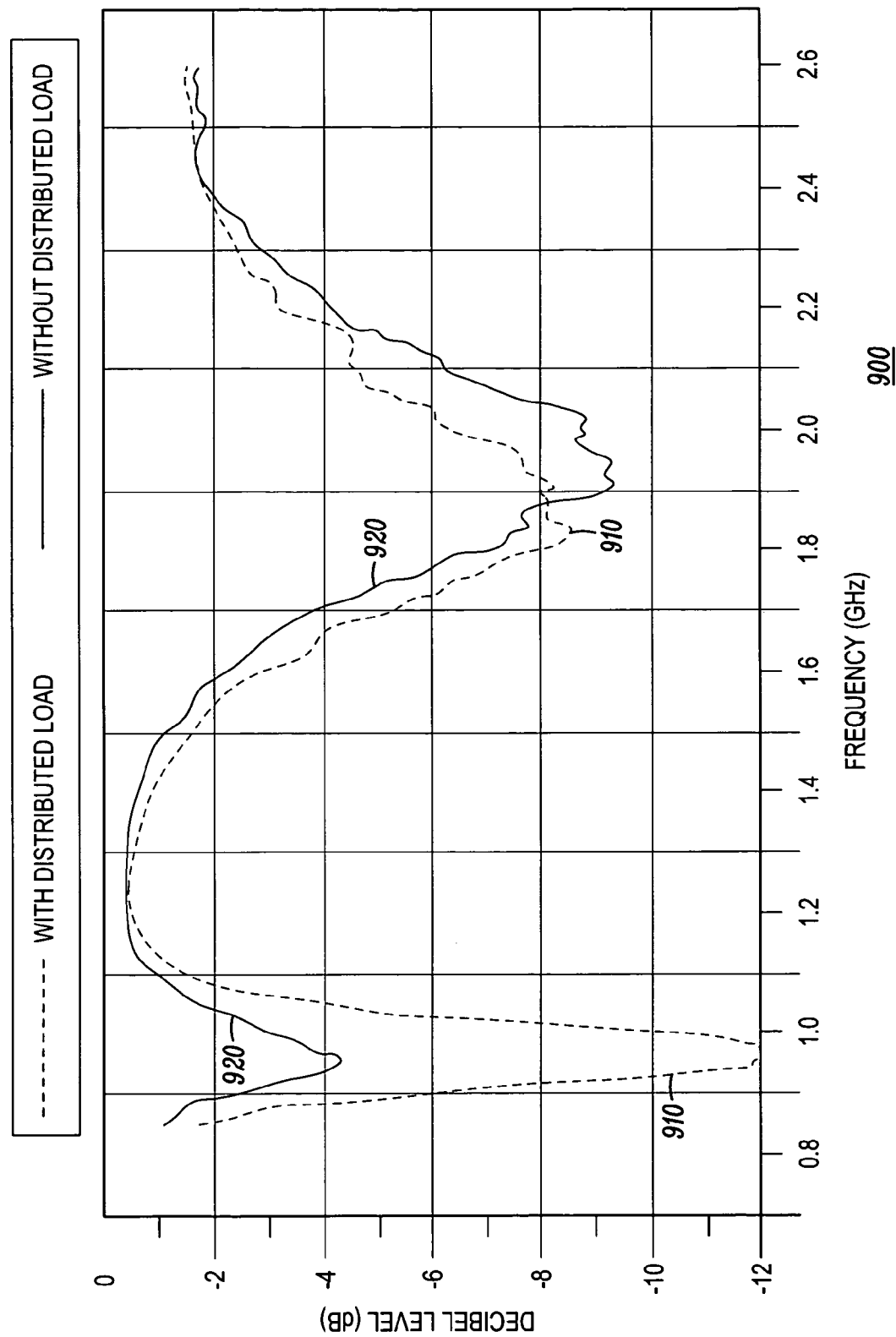
FIG. 9 shows a comparison chart illustrating the changes in decibel levels at various frequency ranges due to the introduction of a distributed load, in accordance with the first detailed embodiment as shown in FIG. 3 and FIG. 4.

FIG. 9 shows a comparison chart 900 illustrating the changes in decibel levels at various frequency ranges due to the introduction of the distributed load 106, in accordance with the first detailed embodiment shown in FIG. 3 and FIG. 4. The curve 910 in FIG. 9 represents the formation of resonance at the lower and higher frequencies in the wireless device 100 with the distributed load 106. The line 920 represents the formation of resonance within a range of frequencies without the distributed load 106. As can be seen at lower frequency range (824–960 MHz), decibel levels of the wireless device 100 with the distributed load 106 show better resonance structure in comparison to the wireless device 100 without the distributed load 106.

These embodiments have the advantage of allowing a shorter mechanical length of a base circuit board having a built-in antenna. The mechanical length is reduced because of the reduction in the electrical length of the base circuit board. The provision of a distributed load between the base circuit board and cover circuit board enables a reduction in the electrical length of the base circuit board. Another advantage of various embodiments of the invention is the improved performance at lower range frequencies. As shown in FIG. 8 and FIG. 9, the efficiency and the resonance have improved at the lower frequency ranges (824–960 MHz). The improvement in the efficiency has been achieved along with the reduction in the electrical length of the base circuit board.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including" and/or "having", as used herein, are defined as comprising. The term "coupled", as used herein with reference to electrical technology, is defined as connected, although not necessarily directly, and not necessarily mechanically.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

While several embodiments of the invention have been illustrated and described, it is to be understood that the invention is not so limited. Numerous modifications, changes, variations, substitutions and equivalents will occur to those skilled in the art without departing from the spirit and scope of the invention as defined by the appended claims.

The invention claimed is:

1. A wireless device comprising:
   a first circuit board with a first ground plane;
   a second circuit board with an antenna and a second ground plane;
   an inductive coupling between the first ground plane and the second ground plane; and
   a capacitive coupling between the first ground plane and the second ground plane,
   wherein the inductive coupling and the capacitive coupling form a parallel resonance at a frequency of interest.

2. The wireless device of claim 1, wherein the capacitive coupling comprises an air gap.

3. The wireless device of claim 2, wherein the air gap is between a conductive finger physically and electrically coupled to the second ground plane and a conductive barrel physically and electrically coupled to the first ground plane.

4. The wireless device of claim 2, wherein the air gap is between the first ground plane and a conductive patch physically and electrically coupled to the second ground plane.

5. The wireless device of claim 1, wherein the capacitive coupling comprises a patch physically and electrically coupled to the second ground plane and capacitively coupled to the first ground plane at the frequency of interest.

6. The wireless device of claim 5, wherein the patch comprises a material with a high coefficient of conductivity.

7. The wireless device of claim 1, wherein the inductive coupling is physically and electrically coupled to the first ground plane and the second ground plane at the frequency of interest.

8. The wireless device of claim 1, further comprising a first hinge between the first circuit board and the second circuit board.

9. The wireless device of claim 8, wherein the capacitive coupling goes through the first hinge.

10. The wireless device of claim 8, further comprising a second hinge between the first circuit board and the second circuit board.

11. The wireless device of claim 10, wherein the inductive coupling goes through the second hinge.

12. The wireless device of claim 1, wherein the antenna comprises a folded J antenna.

13. The wireless device of claim 1, wherein the antenna is located along a first edge of the second circuit board.

14. The wireless device of claim 13, wherein a first hinge is located along a second edge of the second circuit board, the second edge being opposite to the first edge.

15. The wireless device of claim 14, wherein the capacitive coupling goes through the first hinge.

16. The wireless device of claim 14, further comprising a second hinge located on the second edge of the second circuit board.

17. The wireless device of claim 16, wherein the inductive coupling goes through the second hinge.

18. The wireless device of claim 1, wherein the wireless device comprises a multi-band communication device.

19. The wireless device of claim 1, wherein the inductive coupling comprises a lumped element.

20. The wireless device of claim 1, wherein the capacitive coupling comprises a lumped element.

* * * * *